United States Patent
Wang et al.

(10) Patent No.: US 8,987,134 B2
(45) Date of Patent: Mar. 24, 2015

(54) RELIABLE INTERCONNECT FOR SEMICONDUCTOR DEVICE

(71) Applicant: GLOBALFOUNDRIES Singapore Pte. Ltd., Singapore (SG)

(72) Inventors: Zhehui Wang, Singapore (SG); Kwee Liang Yeo, Singapore (SG); Hai Cong, Singapore (SG); Huang Liu, Singapore (SG); Wen Zhan Zhou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/911,095

(22) Filed: Jun. 6, 2013

(65) Prior Publication Data
US 2013/0328201 A1    Dec. 12, 2013

Related U.S. Application Data

(60) Provisional application No. 61/656,488, filed on Jun. 6, 2012.

(51) Int. Cl.
| | |
|---|---|
| H01L 21/768 | (2006.01) |
| H01L 23/522 | (2006.01) |
| H01L 23/532 | (2006.01) |
| H01L 23/48 | (2006.01) |
| H01L 21/311 | (2006.01) |

(52) U.S. Cl.
CPC ........ *H01L 23/481* (2013.01); *H01L 21/76897* (2013.01); *H01L 21/76816* (2013.01); *H01L 21/31144* (2013.01)

USPC ........... 438/648; 438/637; 438/669; 438/687

(58) Field of Classification Search
None
See application file for complete search history.

(56) References Cited

U.S. PATENT DOCUMENTS

| | | | | |
|---|---|---|---|---|
| 6,284,642 | B1 * | 9/2001 | Liu et al. | 438/622 |
| 7,119,010 | B2 * | 10/2006 | Lim et al. | 438/638 |
| 8,299,625 | B2 * | 10/2012 | Ponoth et al. | 257/774 |
| 2002/0155693 | A1 * | 10/2002 | Hong et al. | 438/618 |
| 2008/0265422 | A1 * | 10/2008 | Ellis-Monaghan et al. | 257/758 |
| 2008/0284031 | A1 * | 11/2008 | Colburn | 257/758 |
| 2011/0079907 | A1 * | 4/2011 | Farooq et al. | 257/751 |
| 2012/0302059 | A1 * | 11/2012 | Aton et al. | 438/669 |
| 2013/0005147 | A1 * | 1/2013 | Angyal et al. | 438/692 |
| 2013/0026639 | A1 * | 1/2013 | Arnold et al. | 257/773 |

OTHER PUBLICATIONS

Definition of alignment downloaded from URL http://www.merriam-webster.com/dictionary/alignment on May 28, 2014.*

* cited by examiner

*Primary Examiner* — Joseph Schoenholtz
(74) *Attorney, Agent, or Firm* — Horizon IP Pte. Ltd.

(57) ABSTRACT

Semiconductor devices and methods of making thereof are disclosed. The semiconductor device includes a substrate prepared with a first dielectric layer formed thereon. The dielectric layer includes at least first, second and third contact regions. A second dielectric layer is disposed over the first dielectric layer. The device also includes at least first, second and third via contacts disposed in the second dielectric layer. The via contacts are coupled to the respective underlying contact regions and the via contacts do not extend beyond the underlying contact regions.

11 Claims, 9 Drawing Sheets

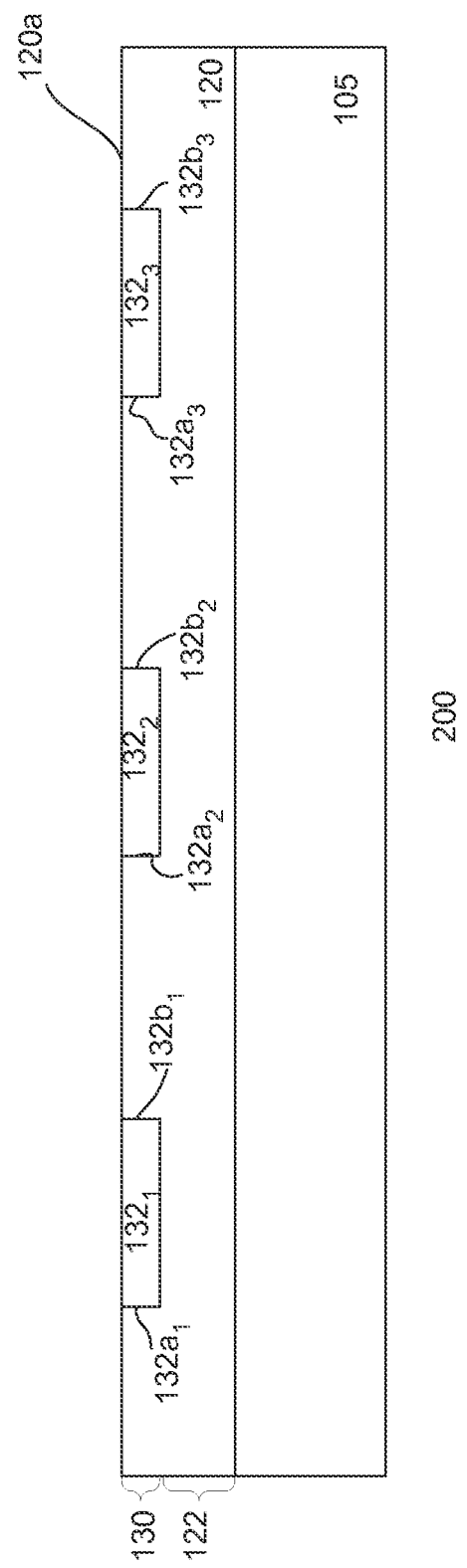

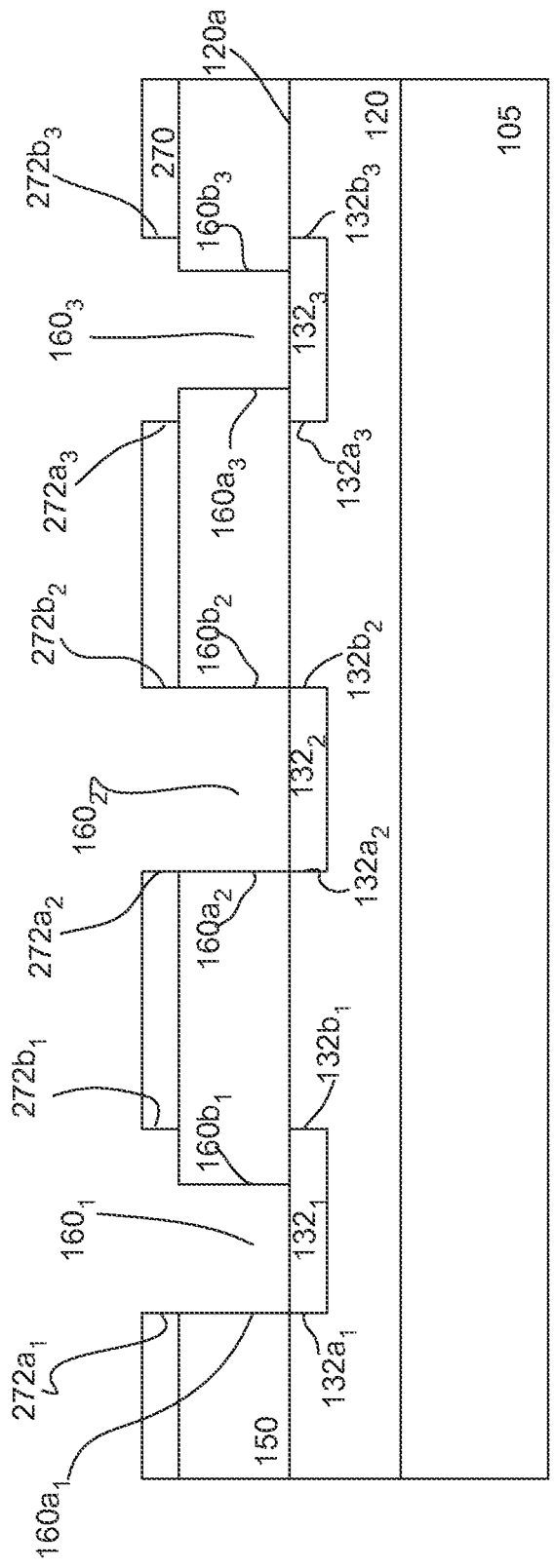

US 8,987,134 B2

RELIABLE INTERCONNECT FOR SEMICONDUCTOR DEVICE

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench in an upper portion. The via serves as a contact to a device while the trench contains the conductive line for connecting the device to, for example, other devices.

It is important for via contacts in an upper interconnect level to be coupled properly with the underlying conductive lines of a lower interconnect level. However, lithographic errors, such as via misalignment or develop critical dimension (DCD) which is larger than the desired CD, may result in via contacts being extended beyond or displaced from the underlying conductive lines. As a result, the separation distance between the via contact and the adjacent lower conductive line is reduced. This may lead to electrical shorts between the via contact above and the adjacent conductive line below. Moreover, via contacts which extend beyond or fails to land on the underlying conductive lines may cause electrical shorts to the layer beneath the lower conductive layer due to punch through. These phenomena adversely render the IC malfunction.

From the foregoing discussion, it is desirable to provide a device which is devoid of the above-mentioned problem, thus increasing the reliability of the IC. It is also desirable to provide a cost effective process for forming the device.

SUMMARY

Embodiments generally relate to semiconductor devices and methods of making thereof. In one embodiment, a device is presented. The device includes a substrate prepared with a first dielectric layer formed thereon. The dielectric layer includes at least first, second and third contact regions. A second dielectric layer is disposed over the first dielectric layer. The device also includes at least first, second and third via contacts disposed in the second dielectric layer. The via contacts are coupled to the respective underlying contact regions and the via contacts do not extend beyond the underlying contact regions.

In another embodiment, a method for forming a device is presented. The method includes providing a substrate prepared with a first dielectric layer formed thereon. The dielectric layer includes at least first, second and third contact regions. A second dielectric layer is formed over the first dielectric layer. At least first, second and third via contacts are formed in the second dielectric layer. The via contacts are coupled to the respective underlying contact regions and the via contacts do not extend beyond the underlying contact regions.

In yet another embodiment, a method for forming a device is disclosed. The method includes providing a substrate prepared with a first dielectric layer formed thereon. The dielectric layer includes at least first, second and third contact regions. A second dielectric layer is formed over the first dielectric layer. At least first, second and third via contacts are formed in the second dielectric layer. The via contacts are coupled to the respective underlying contact regions and at least one of the first, second and third via contacts includes at least a sidewall which is aligned with a sidewall of the respective underlying contact region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-h show an embodiment of a process for forming a portion of an IC.

DETAILED DESCRIPTION

Embodiments generally relate to devices, such as semiconductor devices or ICs. Other types of devices, such as micro electro-mechanical systems (MEMS), liquid crystal displays, are also useful. The ICs can be any type of IC, for example dynamic or static random access memories, signal processors, or system-on-chip devices. The ICs can be incorporated into, for example, consumer electronic products, such as computers, cell phones, and personal digital assistants (PDAs).

Figure 1:
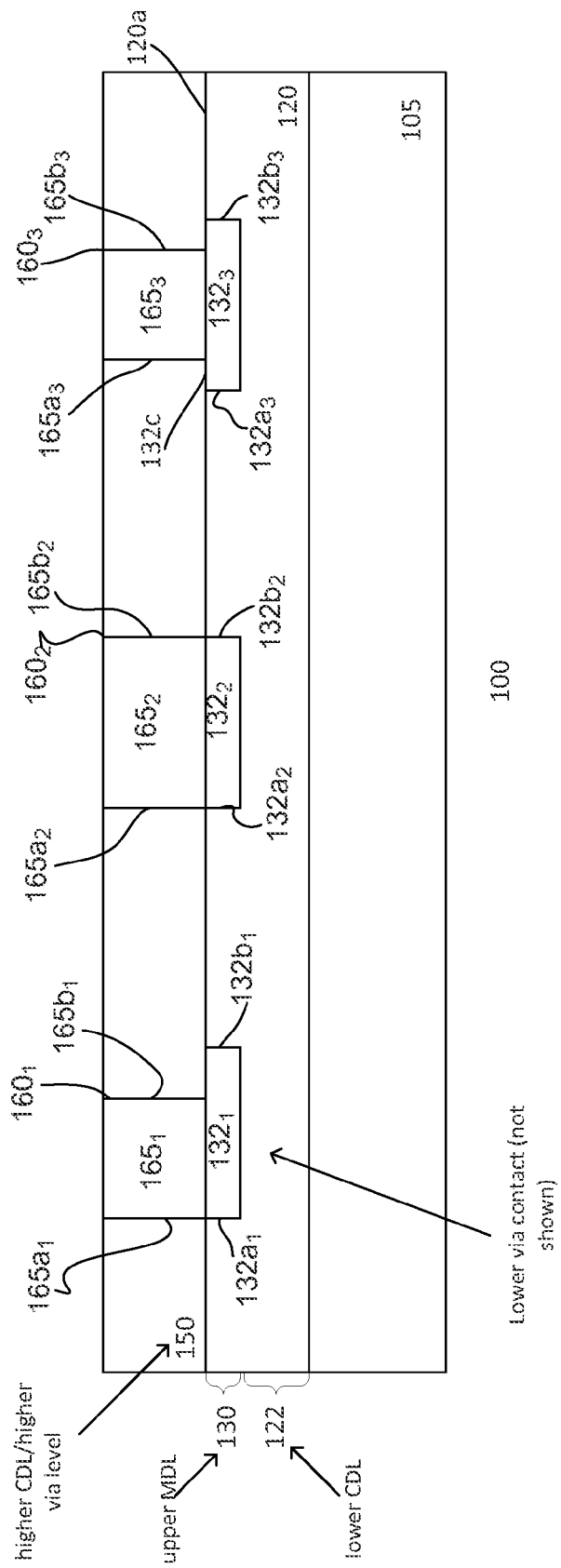
FIG. 1 shows a cross-sectional view of an embodiment of a portion of an IC.

FIG. 1 shows an embodiment of a portion of a device, such as an integrated circuit (IC) 100. Other types of devices are also useful. As shown, the portion includes a substrate 105. The substrate, for example, includes a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

A dielectric layer 120 is disposed on the substrate 105. The dielectric layer, for example, serves as an interlevel dielectric (ILD) layer in which interconnects are formed. The interconnects provide the desired interconnections for the different circuit components. The ILD layer, for example, can be a single layer or multiple layered stack. The dielectric layer, in one embodiment, includes a low-k (LK) or ultra low-k (ULK) dielectric material. Various types of low-k or ultra low-k materials, such as organo-silicate glass (OSG), fluorine-doped silicate glass (FSG) or SiCOH can be used. In one embodiment, the dielectric layer is nitrogen-doped silicon carbide (Nblok). Other suitable types of dielectric materials are also useful. For example, the dielectric layer can include silicon oxide, undoped or doped silicate glasses such as boron phosphate silicate glass (BPSG) and phosphate silicate glass (PSG).

A diffusion barrier layer (not shown), in some cases, may be provided. The barrier layer serves to prevent diffusion of the interconnect material, such as copper, into the dielectric layer. The diffusion barrier, for example, may be Nblok or SiN. The diffusion barrier, for example, may be disposed below and/or above the dielectric layer. Other configurations may also be useful.

The ILD layer includes an upper metal dielectric layer (MDL) 130 and a contact dielectric layer (CDL) 122. The MDL forms a metal level and the CDL forms a contact or via level. The MDL, in one embodiment, forms a metal level Mx, where x=1 to n for an IC having n metal levels. For example, the metal level can be any metal level from the first to and including the penultimate metal level. In the case when the metal level is M1 (first metal level), the CDL may be referred to as CA while for other metal levels, the CDL is referred to as a via level Vx−1. For example, for metal level Mx, the CDL is Vx−1. Other designations for the levels may also be useful.

As shown in FIG. 1, interconnects are disposed in the MDL. The interconnects, for example, are conductive lines. Contacts (not shown) are provided in the contact level below. The conductive lines, for example, may be conductive lines 132 of a metal level Mx where x is not equal to n (e.g., top metal level), such as M2. For a device with more than 2 metal or interconnect levels (e.g., n≥3), the conductive lines may be conductive lines of other MDLs. The conductive lines, for example, may be referred to as contact regions. For illustration purpose, first, second and third conductive lines or contact regions 132$_{1-3}$ are shown. It is understood that other number of contact regions are also useful. The conductive lines, as shown, include vertical sidewall profile. It is understood that the conductive lines may include non-vertical sidewall profile. The top surfaces 132c of the contact regions, for example, are substantially coplanar with top surface 120a of the MDL.

The interconnects are formed of a conductive material. For example, the conductive material can be any metal or alloy. The conductive material may include copper, aluminum, tungsten, their alloys, or a combination thereof. In one embodiment, the conductive material includes copper. Other suitable types of conductive materials may also be useful. It is understood that the contacts (not shown) and conductive line can include the same or different materials.

An additional or upper dielectric (UD) layer 150 is disposed over the ILD layer 120. The UD layer, in one embodiment, is disposed above the ILD layer. The UD layer forms the next higher contact level Vx for interconnect level Mx below. For example, the UD layer may be V1 disposed over M1. Other MDLs and CDLs may also be useful. The UD layer may include the same material as the ILD layer as described above. As such, common details will not be described or described in detail. The UD layer may also include different material than the MDL. The thickness of the UD layer, for example, is about 0.2 µm. Other suitable thickness ranges may also be useful. The UD layer should have a thickness equal to a desired height of contacts in CDLs.

As discussed, a diffusion barrier may be disposed between the MDL and UD. The diffusion barrier prevents diffusion of conductive material from the interconnects. The diffusion barrier, for example, may be NBlok or SiN. Other types of diffusion barrier materials may also be used.

The UD layer, in one embodiment, includes a plurality of via openings. For illustration purpose, the dielectric layer includes first, second and third via openings 160$_{1-3}$. First, second and third via contacts 165$_{1-3}$ are disposed in the via openings. It is understood that the UD layer may include other number of via openings with via contacts in communication with the contact regions. A via opening is designed to have a designed via opening width $W_{DV}$. The designed via opening width is based on the desired via contact width. The designed via contact width is less than an interconnect width $W_I$ of the contact region, defined by interconnect sidewalls 132a-b of the contact region, with which the via opening is in communication. It is understood that not all interconnects have the same width. Likewise, not all contacts have the same width. For example, the $W_{DV}$ depends on $W_I$. For example, for wider interconnects, $W_{DV}$ may be greater than that of the contacts for narrower interconnects.

Via openings may have a via actual width $W_{AV}$ different than $W_{DV}$. For example, via openings may have a $W_{AV}$ which is greater than, equal to or less than $W_{DV}$. The difference in $W_{AV}$ and $W_{DV}$ may be due to under and over exposure of the photoresist mask used to form the via openings. There may be other reasons for the difference in widths between $W_{AV}$ and $W_{DV}$.

As shown, the third via contact 165$_3$ reflects a contact which is centrally positioned or aligned with the contact region 132$_3$. In this case, exposure conditions are according to process conditions. For example, $W_{AV}=W_{DV}$. The $W_{AV}$ may be different with $W_{DV}$ due to exposure issues. For example, sidewalls 165a$_3$ and 165b$_3$ of the third via contact may be within interconnect sidewalls 132a$_3$ and 132b$_3$ of the third contact region. In any case, via sidewalls 165a-b are, at worst, in alignment or within the interconnect sidewalls 132a-b. For example, as reflected by the second via contact 165$_2$, the contact sidewalls 165a$_2$ and 165b$_2$ are in alignment with the interconnect sidewalls 132a$_2$ and 132b$_2$ of the contact region 132$_2$.

As for the first via opening 160$_1$ with the first via contact 165$_1$, it is misaligned. The first via opening 160$_1$, as shown, is misaligned towards the first interconnect sidewall 132a$_1$. Likewise, the misalignment may be towards the second interconnect sidewall 132b$_1$.

As described, various process conditions may cause misalignments or different sizes (collectively via process issues) of via openings for via contacts. However, these via process issues, in accordance with the present disclosure, do not cause misalignment with the contact regions. For example, via opening or contact sidewalls do not extend beyond the sidewalls of the contact regions.

Figure 2B:
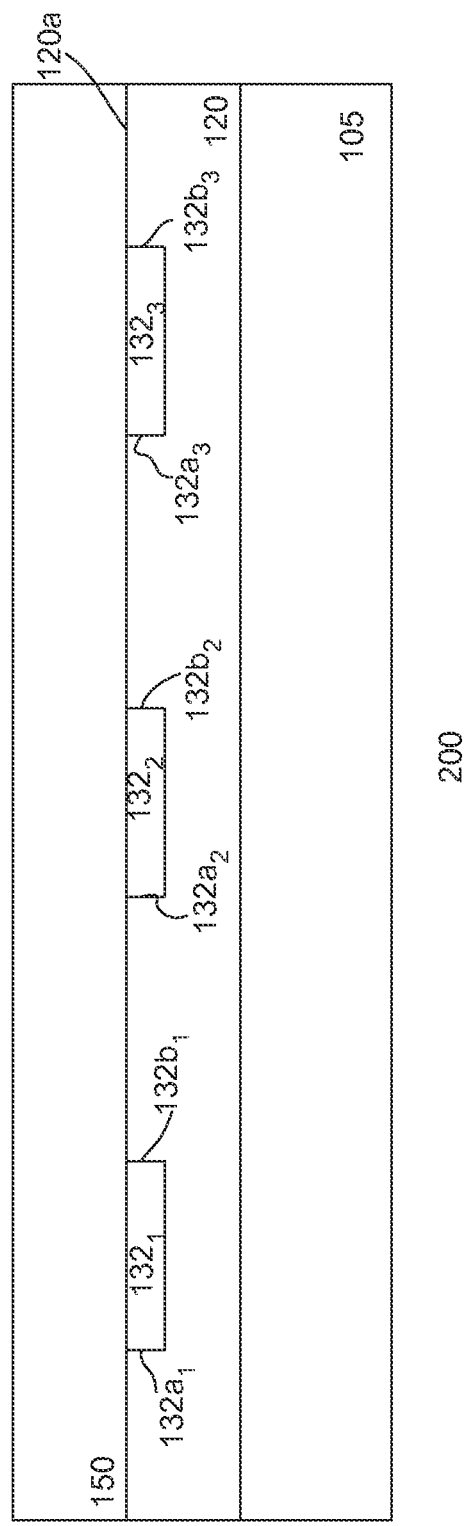

FIGS. 2a-f show an embodiment of a process for forming a portion 200 of a device, such as an IC. Referring to FIG. 2a, a substrate 105 is provided. The substrate, in one embodiment, includes a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate 105 is further prepared with a dielectric layer 120. The dielectric layer, for example, serves as an interlevel dielectric (ILD) layer in which interconnects are formed. The ILD layer, for example, can be a single layer or multiple layered stack.

The dielectric layer includes a low-k (LK) or ultra low-k (ULK) dielectric material. Various types of low-k or ultra low-k materials, such as organo-silicate glass (OSG), fluorine-doped silicate glass (FSG) or SiCOH, can be used. Other suitable types of dielectric materials are also useful. For example, the dielectric layer can include silicon oxide, doped silicon oxide, undoped or doped silicate glasses such as boron phosphate silicate glass (BPSG) and phosphate silicate glass (PSG).

A diffusion barrier layer (not shown), in some cases, may be provided. The barrier layer serves to prevent diffusion of the interconnect material, such as copper, into the dielectric layer. The diffusion barrier, for example, may be Nblok or SiN. The diffusion barrier, for example, may be disposed below and/or above the dielectric layer. Other configurations may also be useful.

The dielectric layer can be formed using various types of deposition techniques. For example, chemical vapor deposition (CVD) processes such as plasma enhanced (PECVD), high density (HDCVD), atmospheric pressure (APCVD) can be used. Other suitable types of techniques, such as spin-on processes, are also useful. The specific process, for example, can depend on the type of material used and application.

The ILD layer includes a MDL 130 and a CDL 122. Referring to FIG. 2a, interconnects are formed in the MDL. The interconnects, for example, are conductive lines 132. Contacts (not shown) are formed in the contact level below. Various suitable techniques, such as damascene or dual damascene techniques may be used to form the interconnects. Other techniques, such as reactive ion etching (RIE), can also be useful. The conductive lines 132, for example, may be conductive lines of a metal level Mx, where x is not equal to n (e.g., top metal level), such as M2. For a device with more than 2 metal or interconnect levels (e.g., n≥3), the interconnects may be conductive lines of other MDLs. The conductive lines, for example, may be referred to as contact regions. For illustration purpose, first, second and third conductive lines or contact regions $132_{1-3}$ are formed. Forming other number of contact regions is also useful.

For example, in a dual damascene process, via openings (not shown) and trenches are formed in the ILD layer to produce dual damascene interconnect structures. The trenches and/or via openings, for example, include a straight sidewall profile. Providing trenches and/or via openings with non-straight sidewall profile is also useful. The conductive lines and contacts (not shown) can be formed from the same material or from different materials. Conductive material is deposited on the ILD layer covering and filling the dual damascene structures. The conductive material, for example, includes copper, aluminum, tungsten, alloys such as Al doped Cu, Mn doped Cu, or a combination thereof. Other suitable types of conductive materials may also be used. In one embodiment, the conductive material includes copper. The conductive material can be deposited by electro-plating. Other suitable types of techniques, such as electroless plating, CVD, PVD, or sputtering, may also be useful. A barrier layer (not shown) may be provided, lining the surface of the ILD and dual damascene structure prior to deposition of the conductive material.

Excess material on the surface of the ILD layer, for example, is removed by a planarizing process to form a planar surface 132c with the top surface of the ILD layer 120a. For example, excess conductive material on the surface of the ILD layer is removed by a polishing process, such as chemical mechanical polishing (CMP). Other suitable types of techniques may also be used to remove the excess material.

An additional or upper dielectric (UD) layer 150, as shown in FIG. 2b, is formed over the ILD layer. The UD layer 150, in one embodiment, is provided above to form the next higher contact level Vx for interconnect level Mx below. For example, the UD layer may be V1 disposed over M1. The UD layer 150 may include the same material and formed by the same process as the ILD layer 120 as described above. As such, common details will not be described or described in detail. The UD layer 150 may also be formed of different material and by different technique than the ILD layer. The thickness of the UD layer, for example, is about 0.2 μm. Other suitable thickness ranges may also be useful, so long as it has a sufficient thickness equal to a desired height of contacts in CDLs.

Figure 2C:
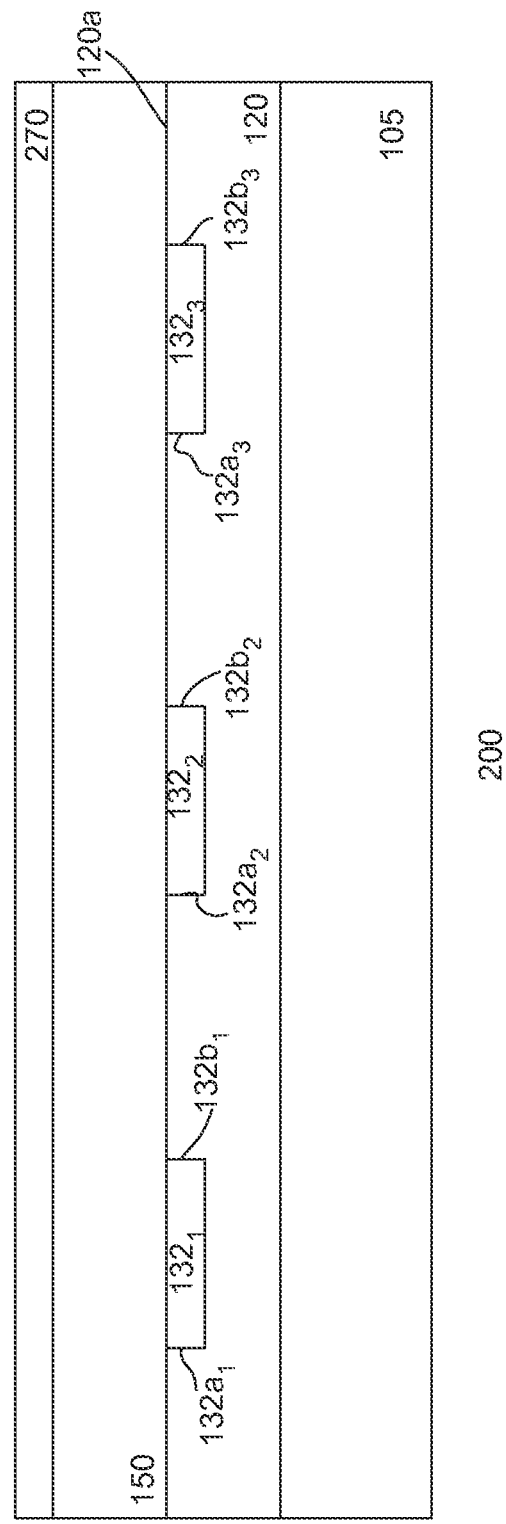

In one embodiment, a mask layer is formed over the UD layer 150 as shown in FIG. 2c. The mask layer, in one embodiment, includes a conductive mask layer 270. The conductive mask layer, in one embodiment, includes a metal material. The metal material, in one embodiment, includes Ta, alloy or a combination thereof. Other suitable types of metal materials are also useful. Other types of mask materials whose etch rate is affected by underlying materials may also be useful. For example, the mask material has a faster etch rate when in proximity of conductive or metal versus non-conductive or non-metal materials. In one embodiment, the mask material which is over a conductive material has a faster etch rate compared to that over a dielectric or non-conductive material. The conductive mask layer, for example, is formed over the UD layer using PVD. Any other suitable types of techniques may also be used. The thickness of the conductive mask layer, for example, is about 100 nm. Other suitable thickness ranges may also be useful.

Figure 2D:
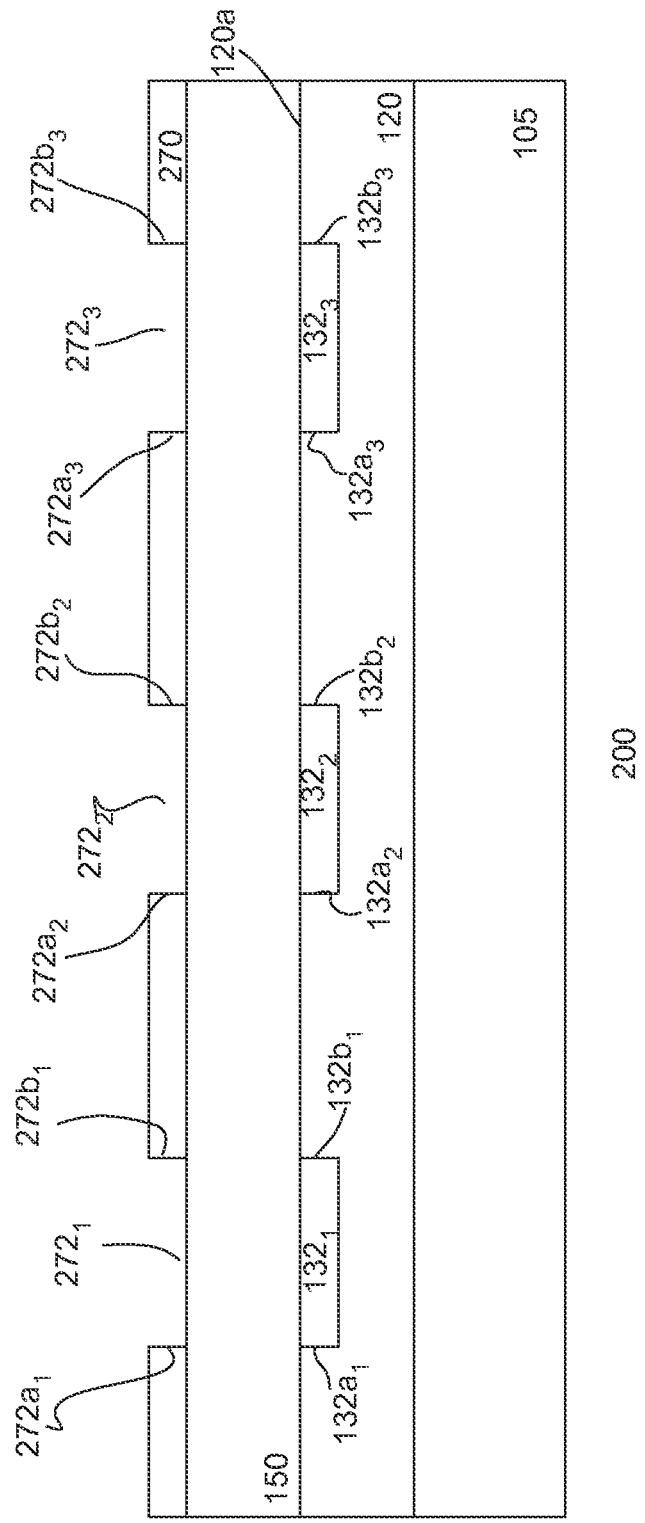

Referring to FIG. 2d, the conductive mask layer 270 is patterned to create a plurality of openings. For illustration purpose, the conductive mask layer 270 is patterned to create first, second and third openings $272_{1-3}$. In one embodiment, the conductive mask layer is patterned without using a mask. The conductive mask layer, for example, is patterned using a mask-less technique. For example, a blanket etch process is performed to remove portions of the conductive mask layer, forming openings corresponding to the vias. In one embodiment, the blanket etch is performed by, for example, $Cl_2$ based plasma etch technique. Other suitable types of techniques may also be useful. In one embodiment, the openings $272_{1-3}$ are in alignment with interconnect sidewalls 132a-b of the contact regions $132_{1-3}$. The width of the openings $272_{1-3}$, for example, is substantially the same as the width of the contact regions $132_{1-3}$ in the MDL. For example, the width of the openings is the same as the width of the contact regions. As shown, the sidewalls $272a_{1-3}$ and $272b_{1-3}$ of the openings are self-aligned with interconnect sidewalls $132a_{1-3}$ and $132b_{1-3}$ of the contact regions.

Figure 2E:
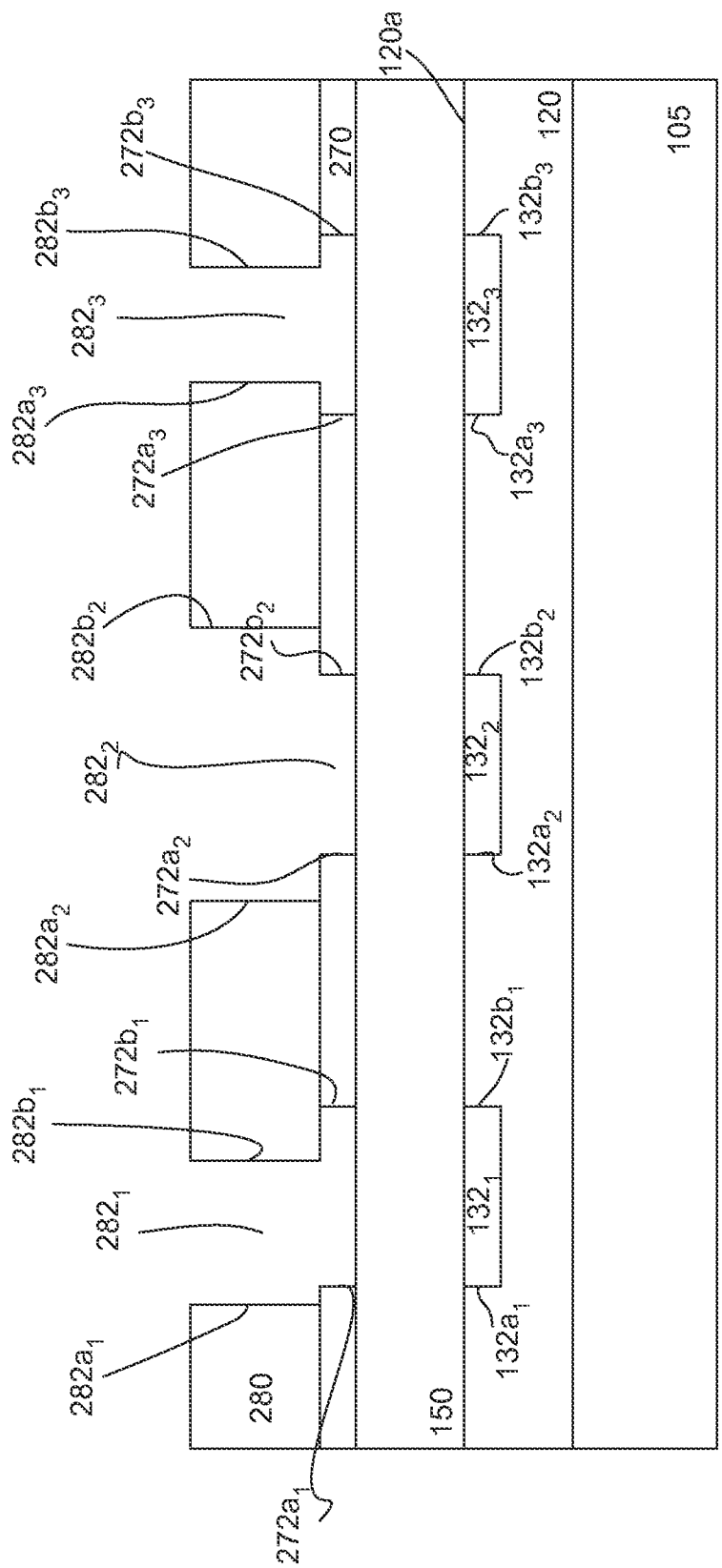

The process continues by patterning the UD layer 150 to form a plurality of via openings $160_{1-3}$. In one embodiment, mask and etch techniques are employed for patterning the UD layer. As shown in FIG. 2e, a soft mask, such as a photoresist 280, can be used. The photoresist, for example, can be formed over the conductive mask layer 270 by various techniques, such as spin-on. Other suitable types of techniques are also useful. The thickness of the soft mask layer, for example, is about 0.5 μm. Other suitable thickness ranges may also be useful. An anti-reflective contacting (ARC) can be formed beneath the soft mask layer. The ARC (not shown), for example, includes organic materials with carbon chains. Other suitable types of ARC layers are also useful.

The soft mask layer, in one embodiment, is selectively exposed and developed to create a pattern. The pattern of the soft mask is transferred to the dielectric layer. In one embodiment, the pattern of the soft mask includes a plurality of openings. For illustration purpose, the pattern of the soft mask, as shown, includes first, second and third openings $282_{1-3}$. Providing other number of openings for the soft mask layer is also useful. As shown, the openings of the soft mask include various configurations. Various process conditions may cause various configurations of the openings of the soft mask. For example, the first opening $282_1$ of the soft mask is misaligned. For example, sidewalls $282a_1$ and $282b_1$ of the first opening of the soft mask are misaligned with interconnect sidewalls $132a_1$ and $132b_1$ of the first contact region $132_1$. The first sidewall $282a_1$ of the first soft mask opening, for example, is beyond the first sidewall $272a_1$ of the first opening $272_1$ of the conductive mask layer and first sidewall $132a_1$ of the first contact region $132_1$. The second opening $282_2$ of the soft mask, for example, is wider than the width of the second contact region $132_2$. For example, sidewalls $282a_2$ and $282b_2$ of the second opening of the soft mask extend beyond the interconnect sidewalls $132a_2$ and $132b_2$ of the second contact region and the sidewalls $272a_2$ and $272b_2$ of the second opening of the conductive mask layer. The third opening $282_3$ of the soft mask, for example, is narrower and centrally aligned with the third contact region $132_3$. In this case, the exposure conditions are according to the process condition. As shown, the sidewalls $282a_3$ and $282b_3$ of the third opening of the soft mask is centrally aligned and within interconnect sidewalls $132a_3$ and $132b_3$ of the third contact region.

An anisotropic etch, such as a reactive ion etch (RIE), is performed to remove portions of the UD layer 150 unprotected by the soft mask and/or the conductive mask layer to form via openings. The etch, in one embodiment, stops on the contact regions. As such, at least portions of the contact regions are exposed. After forming the via openings, the photoresist or soft mask layer is removed. The soft mask is removed by, for example, ashing. Other suitable techniques for removing the soft mask layer are also useful.

Referring to FIG. 2f, the first via opening $160_1$, for example, is misaligned up to the first interconnect sidewall $132a_1$. As shown, the first via opening $160_1$, for example, includes a first sidewall $160a_1$ which is aligned with first sidewall $272a_1$ of the first conductive mask opening $272_1$ and a second sidewall $160b_1$ which is aligned with second sidewall $282b_1$ of the first opening $282_1$ of the soft mask layer. The second via opening $160_2$, for example, include sidewalls $160a_2$ and $160b_2$, which are in alignment with interconnect sidewalls $132a_2$ and $132b_2$. The second via opening $160_2$, for example, includes sidewalls $160a_2$ and $160b_2$ which are aligned with sidewalls $272a_2$ and $272b_2$ of the second conductive mask opening $272_2$ and sidewalls $132a_2$ and $132b_2$ of the second contact region $132_2$. As shown, the second via opening $160_2$ includes a width which is substantially the same as the width of the underlying second contact region $132_2$. The third via opening $160_3$, for example, includes sidewalls $160a_3$ and $160b_3$ which are centrally aligned with and within the third contact region $132_3$. For example, the via opening sidewalls $160a_3$ and $160b_3$ are aligned with the sidewalls $282a_3$ and $282b_3$ of the third opening $282_3$ of the soft mask layer. As shown, the via openings as formed are in alignment or within the interconnect sidewalls. The via openings, as formed, do not extend beyond the sidewalls of the contact regions. The via openings, as shown, includes vertical sidewalls. Providing the via openings with non-vertical sidewalls may also be useful.

Figure 2G:
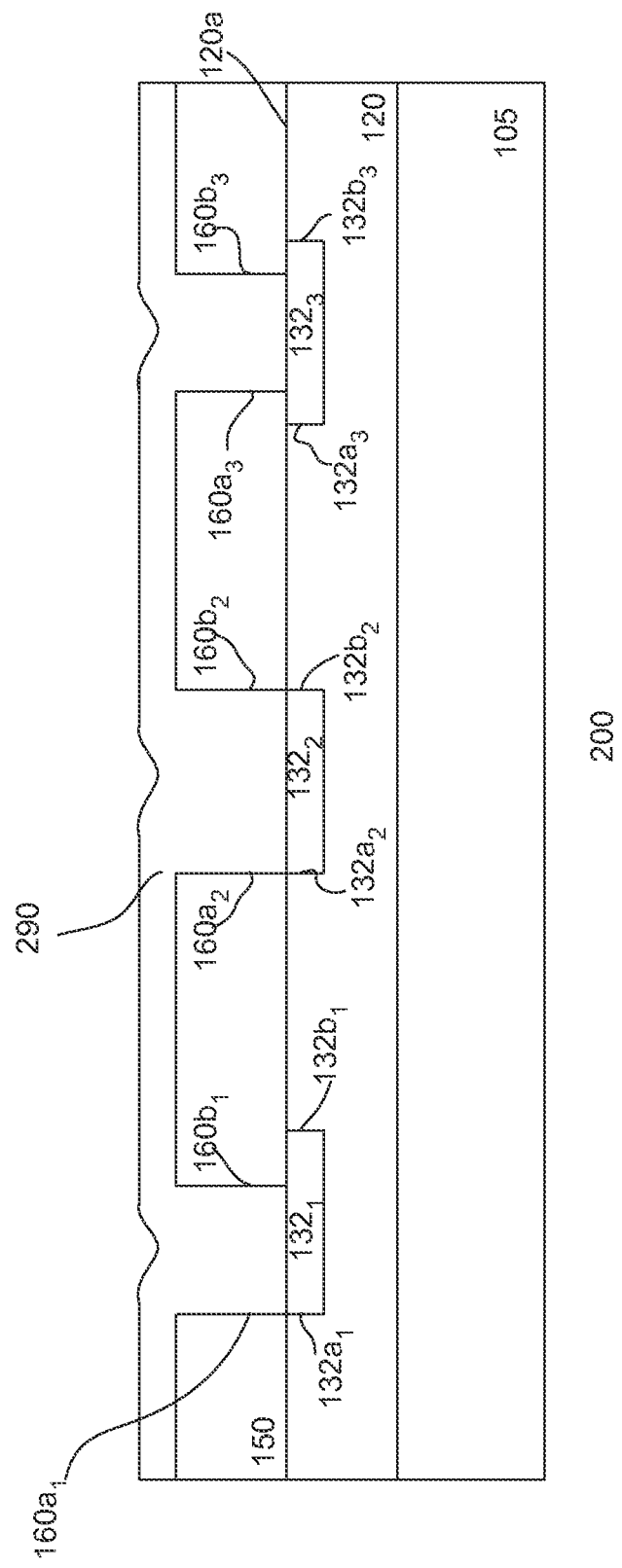

In one embodiment, the process continues by removing the conductive mask layer 270 as shown in FIG. 2g. Alternatively, the conductive mask layer may be removed after at a later stage. For example, the conductive mask layer may be removed after filling the via openings with conductive material as will be described later. In one embodiment, the conductive mask layer is removed by chemical mechanical polishing (CMP) Other suitable techniques may also be employed to remove the conductive mask layer.

The process continues to form via contacts $165_{1-3}$. A conductive material 290 is deposited over the UD layer 150 and filling the via openings $160_{1-3}$ as shown in FIG. 2g. The conductive material, for example, includes copper, aluminum, tungsten, alloys such as Al doped Cu, Mn doped Cu or a combination thereof. Other suitable types of conductive materials may also be useful. In one embodiment, the conductive material includes copper. The conductive material can be deposited by electro-plating. Other suitable types of techniques, such as electroless plating, CVD, PVD, or sputtering, may also be useful. A barrier layer (not shown) may be provided, lining the surface of the UD layer and dual damascene structure prior to deposition of the conductive material.

Figure 2H:
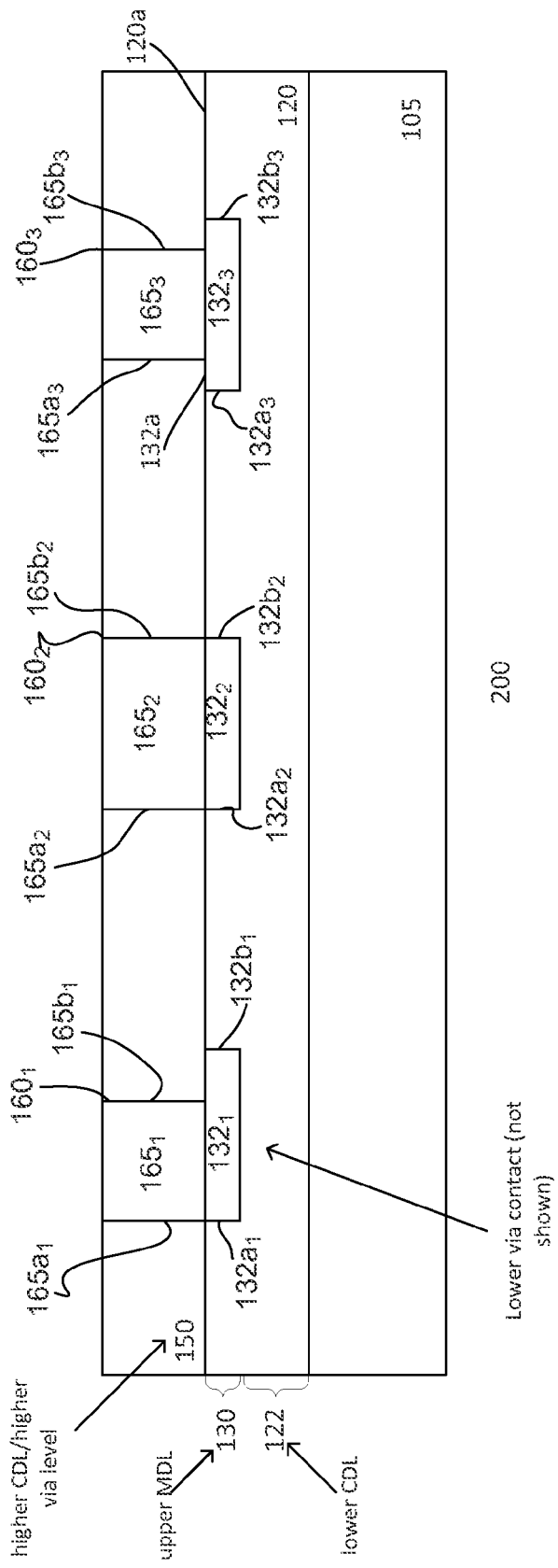

Referring to FIG. 2h, excess material on the surface of the UD layer, for example, is removed by a planarizing process to form a planar surface with the top surface of the UD layer 150. For example, excess conductive material on the surface of the UD layer is removed by a polishing process, such as CMP. Other suitable types of techniques may also be used to remove the excess material.

The process continues to form the IC. For example, additional interconnect levels can be formed. Further processing can include final passivation, dicing, assembly and packaging. Other processes are also useful.

The device and process, as described with respect to FIGS. 1 and 2a-h, result in advantages. It is discovered that substrate surface bond and roughness may impact conductive film/layer property and the rate of deposition of the film which is formed over the substrate. We have also discovered that the blanket etch rate of the conductive mask layer, such as Ta, is sensitive to the underlying UD layer on which it is formed or grown while the UD layer can be impacted by the conductive contact regions formed under the UD layer. For example, we have found that portions of the conductive mask layer over the contact regions have higher etch rate relative to portions of the conductive mask layer over the ILD. Thus, the resulting conductive mask layer after the removal process, such as blanket etch, creates a pattern which is self-aligned to the contact regions below. Accordingly, the patterned conductive mask enables the via contacts to be disposed at least within the underlying contact regions and at most having a sidewall which is aligned with at least one of the sidewalls of the contact regions even if there are process issues which causes misalignment or openings with different sizes. In other words, the patterned conductive mask as described above ensures that the via contacts would not extend beyond or displaced away from the underlying contact regions. As a result, electrical shorts between the via contact above and the adjacent conductive line below is avoided. Additionally, electrical shorts to the multiple layers beneath the lower conductive layer due to punch through are also avoided.

Furthermore, the pattern of the conductive mask layer is created without using an additional mask. This enables cost savings in the manufacturing process. Moreover, even if there are process issues, tightened overlay control is not required. Therefore, the process as described provides a cost effective and simplified solution for forming a device with high reliability.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
    providing a substrate prepared with a first dielectric layer formed thereon, wherein the dielectric layer comprises at least first, second and third contact regions;
    forming a second dielectric layer over the first dielectric layer;

forming a conductive mask layer having top and bottom planar surfaces on and contacts the second dielectric layer;

patterning the conductive mask layer to form at least first, second and third conductive mask openings without using a mask; and forming at least first, second and third via contacts in the second dielectric layer, wherein the via contacts are coupled to the respective underlying contact regions and the via contacts do not extend beyond the underlying contact regions.

2. The method of claim 1 wherein the conductive mask layer comprises a metal material having a faster etch rate when in proximity with conductive material versus non-conductive material.

3. A method for forming a device comprising:

providing a substrate prepared with a first dielectric layer formed thereon, wherein the dielectric layer comprises at least first, second and third contact regions;

forming a second dielectric layer over the first dielectric layer;

forming a conductive mask layer over the second dielectric layer, wherein the conductive mask layer comprises Ta, the contact regions comprise copper and the second dielectric layer comprises NBlok; and forming at least first, second and third via contacts in the second dielectric layer, wherein the via contacts are coupled to the respective underlying contact regions and the via contacts do not extend beyond the underlying contact regions.

4. The method of claim 2 wherein the metal material comprises Ta, alloy or a combination thereof.

5. The method of claim 1 wherein the conductive mask layer is patterned using a blanket etch technique.

6. The method of claim 1 wherein the first, second and third conductive mask openings are self-aligned with the first, second and third contact regions.

7. The method of claim 1 comprising forming a patterned soft mask having at least first, second and third openings over the conductive mask layer having the conductive mask openings.

8. The method of claim 7 wherein the first soft mask opening is misaligned with the underlying first opening of the conductive mask layer, the second soft mask opening is wider than the underlying second opening of the conductive mask layer and the third soft mask opening is narrower than the underlying third opening of the conductive mask layer.

9. The method of claim 8 comprising removing portions of the second dielectric layer unprotected by the soft mask or the conductive mask layer to form at least first, second and third via openings.

10. The method of claim 9 wherein the first via opening comprises a first sidewall which is aligned with first sidewall of the first conductive mask opening and a second sidewall which is aligned with second sidewall of the first soft mask opening.

11. The method of claim 9 wherein the second via opening comprises first and second sidewalls which are aligned with first and second sidewalls of the second conductive mask opening.

* * * * *